United States Patent [19]
Freymuth

[11] Patent Number: 4,644,255
[45] Date of Patent: Feb. 17, 1987

[54] FREE WHEELING DIODE CONTROL CIRCUIT FOR MOTOR SPEED CONTROL WITH REVERSE VOLTAGE PROTECTION

[75] Inventor: William P. Freymuth, Tulsa, Okla.

[73] Assignee: Airborne Electronics, Inc., Plano, Tex.

[21] Appl. No.: 838,424

[22] Filed: Mar. 7, 1986

Related U.S. Application Data

[63] Continuation of Ser. No. 677,758, Dec. 4, 1984, abandoned.

[51] Int. Cl.$^4$ .............................................. G05F 1/44
[52] U.S. Cl. ................................... 323/282; 318/139; 361/91
[58] Field of Search ...................... 323/282, 286, 287; 318/139; 361/56, 91, 111, 33

[56] References Cited

U.S. PATENT DOCUMENTS 4,112,475 9/1978 Stitt et al. .............................. 361/33
4,196,462 4/1980 Pohl ...................................... 361/33

Primary Examiner—Patrick R. Salce
Assistant Examiner—Anita M. Ault
Attorney, Agent, or Firm—Sigalos & Levine

[57] ABSTRACT

An apparatus for controlling the inductive currents and voltages of a load when the current through the load is suddenly switched off. It comprises primarily a series connection of a diode with its cathode connected to the high voltage of the power supply, connected through a NPN transistor which is connected to the junction between the load and the electronic switch. The control electrode of the NPN is operated by a PNP transistor whose control comes from the voltage at the junction between the load and the electronic switch with respect to ground potential. Normally, the NPN transistor is cut off and blocks the flow of inductive current from the load from passing through the NPN transistor and the diode to the high voltage lead to the motor. However, when the current through the motor or other inductive load is cut off, an inductive voltage appears at the junction between the load and the switch. If this is positive with respect to ground, then the PNP transistor will conduct and will cause the NPN transistor to conduct and reactive current will flow from the junction between the load and the switch through the NPN transistor and through the diode to the high voltage end of the load. This current will flow so long as the potential of the junction between the load and the switch is higher than ground and when the reactive voltage disappears the current drops to zero and the circuit is ready for the next operation of the electronic switch.

5 Claims, 1 Drawing Figure

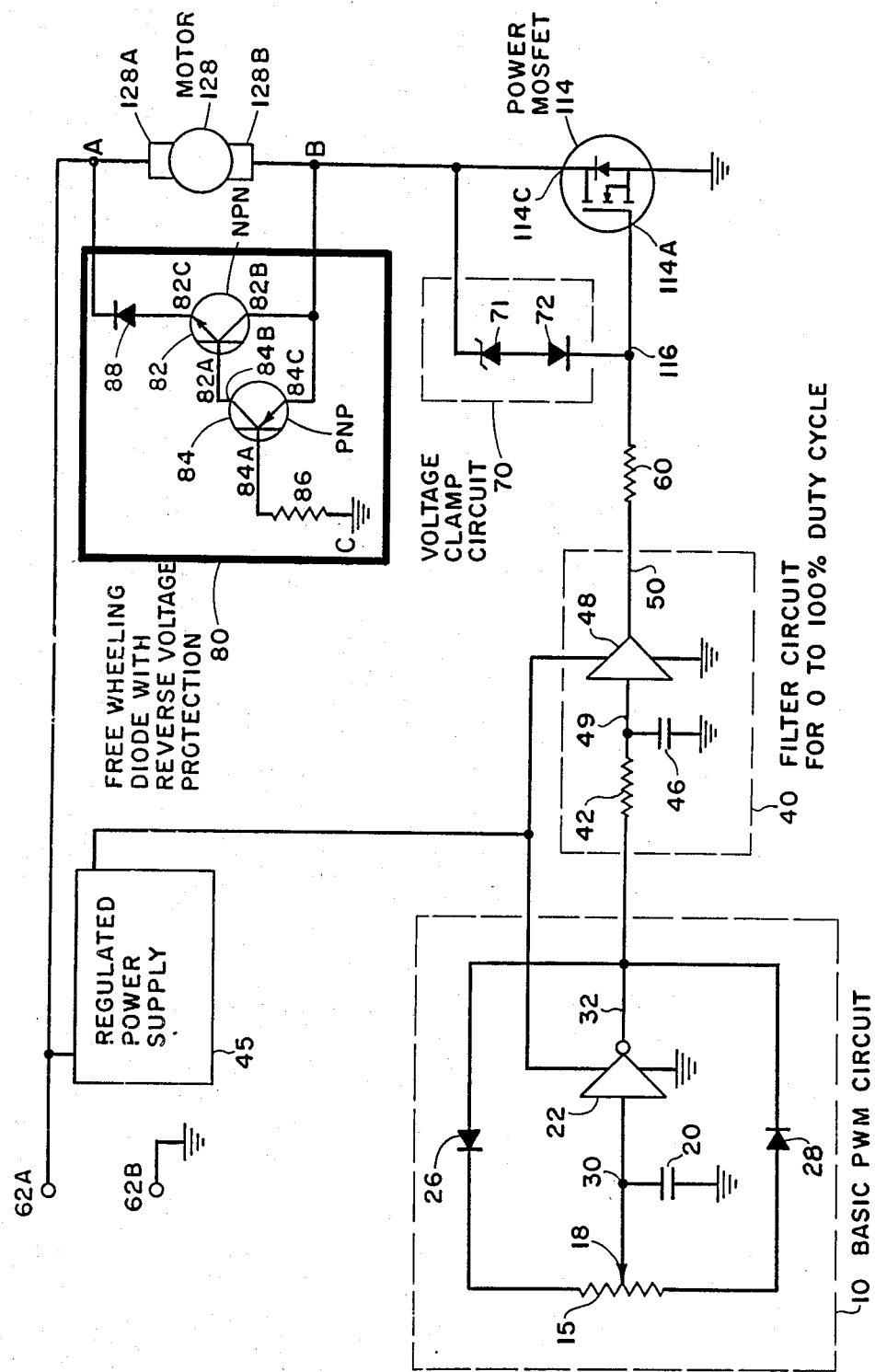

FREE WHEELING DIODE CONTROL CIRCUIT FOR MOTOR SPEED CONTROL WITH REVERSE VOLTAGE PROTECTION

This application is a continuation, of application Ser. No. 677,758, filed Dec. 4, 1984 now abandoned.

CROSS-REFERENCE TO RELATED APPLICATIONS

This application is one of a group of three applications, all filed on the same date in the U.S. Patent and Trademark Office. Each of these separate applications covers one of several different inventions which can be used together in a preferred system or which can be used separately with other types of control apparatus. For example;

Ser. No. 838,426, "A PULSE WIDTH MODULATION CONTROL CIRCUIT WITH A VARIABLE ZERO TO ONE HUNDRED PER CENT DUTY CYCLE", concerns a variable Pulse Width Modulated apparatus for controlling the average current through a load from zero to one hundred per cent. It can be used with a variety of driver circuits driving electronic switches to control the average current and, thus, power through a load.

Ser. No. 838,425, "A VOLTAGE CLAMP CIRCUIT FOR SWITCHED INDUCTIVE LOADS", covers a circuit means for clamping the voltage generated when a load current is cut off by an electronic switch and an inductive voltage is generated trying to maintain the current through the load and the switch, means are provided for limiting this inductive voltage and for using it to momentarily turn the electronic switch back on in order to pass the inductive current which represents the energy still in the load.

Ser. No. 838,424, "A FREE WHEELING DIODE CONTROL CIRCUIT FOR MOTOR SPEED CONTROL WITH REVERSE VOLTAGE PROTECTION", describes a system where the speed of a motor is controlled by a switch means and a free wheeling diode. In such a system, the switch means may, also, have an integral reverse diode, i.e., a Power MOSFET or Darlington Power Transistor. Without proper protection, such a system would present a short circuit with reverse polarity. This invention describes a method to protect against this condition.

This application is Ser. No. 838,424.

BACKGROUND OF THE INVENTION

This invention is related to the control of current through a motor using for example, a Pulse Width Modulation method of control. This type of regulation principle is similiar to a DC to DC converter where the supply voltage can be reduced with almost no energy loss. The converter consists of a periodically conductive switch and a free wheeling diode. The motor inductance is used for energy storage so that no additional storage inductance is required. When the switch is closed, the motor inductance is charged with current. When the switch is opened, the current is discharged via the free wheeling diode back through the motor. Therefore, during operation, a continuous motor current flows, the ripple of which is very low.

In the prior art there are examples of circuits which are designed to bypass this current around the motor so that the current can flow in the load even though the switch is open. In general, this turns out to be something like a diode which is connected in parallel across the motor in such a way as to oppose the supply voltage. This diode is then referred to as a Free Wheeling Diode. The only trouble is that for some types of circuits which use a switch means with an integral reverse diode, if the power supply is connected backwards a short circuit will exist through the switch and the free wheeling diode.

SUMMARY OF THE INVENTION

Before explaining in detail the present invention, it is to be understood that the invention is not limited in its application to details of the construction and arrangement of parts illustrated in the accompanying drawings. The invention is capable of other embodiments and of being practiced or carried out in a variety of ways. It is to be understood that the phraseology and terminology employed herein is for the purpose of description and not of limitation.

It is a primary object of this invention to provide electronic circuits for the purpose of handling inductive current, generated when a current passing through an inductive load is suddenly stopped. It is a further object to shunt these currents back through the load, until they drop to zero.

These and other objects are realized and the limitations of the prior art are overcome in this invention by providing an electronic circuit comprising a diode with its cathode connected to the high side of the motor (herein referred to as terminal A) and its anode connected to the emitter of an NPN transistor, the collector of which is connected to the junction between the load and the switch (the low side of the motor and herein referred to as terminal B). A PNP transistor is connected with the emitter connected to the junction between the load and the switch (terminal A) and the base connected through a resistor to ground (herein referred to as terminal C). The collector of the PNP transistor is connected to the base of the NPN Transistor. The diode first described in this circuit functions the same as a free wheeling diode in the prior art.

In this configuration, the base of the PNP transistor is connected at a point of lower voltage than its emitter allowing it to conduct. When the PNP transistor is allowed to conduct, the collector of the PNP transistor can then supply current to the base of the NPN transistor, allowing the NPN transistor to conduct. Under these circumstances, the NPN transistor acts simply as a switch to allow current to flow from the low side of the motor, through the NPN transistor, through the free wheeling diode and on to the high side of the motor. Thus, whenever the terminal B is at a higher potential than terminal A due to inductive energy stored in a motor or other load means and terminal B is at a higher potential than terminal C, the PNP transistor will conduct, causing the NPN transistor to conduct, passing current from terminal B through the NPN transistor means and through the diode to derminal A. However, should voltage be applied to the circuit backwards, the base of the PNP transistor would be at a higher potential than its emitter and thus, would not conduct. Without current flowing through the PNP transistor to the base of the NPN transistor, the NPN transistor would also not conduct, thus, preventing a short circuit from a switch means with an integral reverse diode and, then, through the free wheeling diode around the motor.

BRIEF DESCRIPTION OF THE DRAWING

These and other objects and advantages of this invention and a better understanding of the principles and details of the invention will be evident from the following description taken in conjunction with the appended drawing which;

FIG. 1 is a schematic diagram of a complete motor speed control circuit with a free wheeling diode with reverse voltage protection.

DESCRIPTION OF THE PREFERRED EMBODIMENT

Referring now to the drawing a power supply is indicated by the terminals 62A and 62B with terminal 62A being the positive voltage and terminal 62B the negative voltage terminal which is connected to ground. The positive power voltage goes to a motor 128 which has terminals 128A and 128B. Terminal 128A is connected to the power supply, and terminal 128B is connected to an electronic Switch Circuit 114. The box 70 refers generally to a Voltage Clamp Circuit.

A Pulse Width Modulation Control Circuit is indicated generally by 10 with output 32 which goes to a Filter Circuit indicated generally by 40 with output 50. The Output 50 is a Variable Pulse Width Modulated control signal with a zero to one hundred per cent duty cycle, used to control the Switch 114. Output 50 is connected through resistor 60 to the Gate 114A of Switch 114. A conventional regulated Power Supply for the control circuits is indicated generally by 45.

The control circuit of interest is shown in the heavily outlined box 80. It comprises a diode 88 with cathode attached to motor 128 at 128A and anode connected to the emitter 82C of an NPN transistor 82, the collector 82B of which is connected to motor 128 at 128B. A PNP transistor 84 is connected with its emitter 84C also connected to motor 128 at terminal 128B. The collector 84B of the PNP transistor 84 is connected to the base 82A of the NPN transistor 82. The base 84A of the PNP transistor is connected to ground through resistor 86.

It is evident that diode 88 is connected somewhat in a position of the diodes which, in the prior art circuits, are connected directly across the load. However, the diode 88 is not free to carry current until that current is passed through the transistor 82. This can only occur if the supply voltage is connected correctly, thus, allowing the PNP transistor 84 to conduct and, thus, turning on the NPN transistor 82. If the supply voltage is not connected correctly, the NPN transistor 82 is not turned on, thus, preventing a short through the switch 114 with an integral reverse diode and through this circuit, by-passing the motor 128.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. In an apparatus for controlling the current through a load means having first and second terminals by means of an electronic switch means having first and second terminals, said first switch terminal being in series with said second load terminal across a power supply, the improvement comprising: an electronic circuit means connected to a terminal A which is the high voltage power terminal connected to said first load terminal, a terminal C which is the low voltage power terminal connected to said second switch terminal at ground potential, and a terminal B which is the junction of said second load terminal and said first electronic switch terminal, said electronic circuit means further comprising;
   (a) diode means connected with its cathode to terminal A, and its anode connected to the emitter of an NPN transistor, the collector of said NPN transistor connected to terminal B, and
   (b) the base of said NPN transistor connected to the collector of a PNP transistor; the emitter of said PNP transistor connected to terminal B, the base of said PNP transistor is connected through a first selected resistor to said terminal C whereby when terminal B is at a higher potential than terminal C, said PNP transistor will conduct, causing said NPN transistor to conduct, passing current from terminal B through said NPN transistor means and through said diode to terminal A only if terminal B is at a higher potential than terminal A due to inductive energy stored in the load means.

2. The apparatus as in claim 1 in which said electronic switch means comprises power MOSFET means.

3. An apparatus for controlling the current through a load having input and output terminals coupled to direct current power supply terminals with a predetermined designated high and low voltage polarity comprising:
   (a) a first solid state circuit coupled across said input and output load terminals for coupling current from said output load terminal to said input load terminal when voltage at said output load terminal is greater than the voltage at said input terminal, and
   (b) a second solid state circuit coupled to said first solid state circuit for preventing said first solid state circuit from coupling current from said load output terminal to said load input terminal only if said greater output voltage is caused by reversed polarity of said power supply terminal coupled to said load.

4. An apparatus as in claim 3 wherein said first solid state circuit comprises:
   (a) a diode with its cathode coupled to said load input terminal, and
   (b) an NPN transistor having its emitter coupled to the anode of said diode, its collector coupled to said load output terminal and its base coupled to said second solid state circuit whereby if said power supply is coupled to said load with said predetermined polarity said NPN transistor will conduct if said output voltage exceeds said input voltage and couple current from said output terminal to said input terminal.

5. An apparatus as in claim 4 wherein said second solid state circuit comprises: a PNP transistor having its emitter coupled to said load output terminal, its collector coupled to said base of said NPN transistor and its base coupled to said low voltage power supply terminal whereby if said power supply terminals are coupled to said load with said designated polarity, said PNP transistor actuates said NPN transistor when said load output terminal voltage exceeds said load input terminal voltage and if said power supply terminals are connected to said load in reverse of said designated polarity said PNP transistor disables said NPN transistor to prevent conduction thereof.

* * * * *